(12) United States Patent
Shaw et al.

(10) Patent No.: US 6,249,583 B1
(45) Date of Patent: Jun. 19, 2001

(54) ON-LINE SIGNAL PROCESSING METHOD

(76) Inventors: Venson M. Shaw; Steven M. Shaw, both of 111 Reldyes Ave., Leonia, NJ (US) 07605

( * ) Notice: Subject to any disclaimer, the term of this patent is extended or adjusted under 35 U.S.C. 154(b) by 0 days.

(21) Appl. No.: 08/907,685

(22) Filed: Aug. 8, 1997

Related U.S. Application Data

(63) Continuation-in-part of application No. 08/490,106, filed on Jun. 8, 1995, now Pat. No. 5,712,905.

(51) Int. Cl.[7] ............................... H04K 1/02; H04K 1/10
(52) U.S. Cl. ............................... 380/37; 380/31; 380/36; 713/160
(58) Field of Search ............................... 702/198, 189, 702/124, 126; 364/178, 179; 380/28, 9, 36, 37, 31; 706/25; 704/246, 273, 221–223; 370/93.02–93.04; 713/160, 200

(56) References Cited

U.S. PATENT DOCUMENTS 4,405,942 * 9/1983 Block et al. .......................... 358/119
4,763,207 * 8/1988 Podolak et al. ....................... 360/32

* cited by examiner

*Primary Examiner*—Tod Swann
*Assistant Examiner*—Justin T. Darrow

(57) ABSTRACT

A method for encryption and decryption of analog signal, wherein encryption and decryption are performed in analog domain. The transmitter creating digital representations with unique behavior; producing computation instructions for each digital representation; randomly generating analog identification signals with random waveform appearance and yet preserving common behavior as in said digital representation; encryption through partitioning said analog signal and inserting said analog identification signals prior to, in between, and/or after said partitioned analog signal segments. As a result, encrypted analog signal sequence becomes totally destructed to unauthorized receivers. An authorized receiver measuring incoming analog signal according to said digital representation or said computation instruction, locating identification signals within said incoming signal sequence through satisfying said digital representation; decryption through deleting all said identification signals and reconstructing said incoming analog signal to its original form.

16 Claims, 11 Drawing Sheets

ON-LINE SIGNAL PROCESSING METHOD

CROSS REFERENCE TO RELATED APPLICATION

This patent application claims the benefit of application Ser. No. 08/490,106, now U.S. Pat. No. 5,712,905, filed on Jun. 8, 1995.

BACKGROUND OF THE INVENTION

1. Field of the Invention

The present invention is directed in general to a system for processing analog signals, and more particularly to a system which employs sequential digital profiles to detect analog signals (or fragments of analog signals) satisfying requirements represented by said sequential digital profiles.

2. Description of the Background Art

Due to the real-time performance and storage requirement, recent demands for processing of on-line analog signal in such diversity of emerging applications as smart cards, signature identification, data security, speech recognition, medical diagnosis, and other transaction-oriented applications have required novel methods to be explored and introduced for the effective on-line computation of incoming analog signals. Namely for these new emerging transaction-oriented application the signal channels would typically remain silent until selective authorized users have made and initiated a particular request for the channel usage. The incoming signal sequence will then be comprised of selective user identification code, follow with a sequence of commands, and their relevant data. Due to their nature, such transactions can happen at any of the time instances, and occur in a totally random fashion. Therefore, it is really not possible to predict, anticipate and schedule these events employing traditional scheduling, optimization, and computation methods as described in the background arts.

As a result, although there are plenty of background arts for example, Oppenheim A. V. and chafer, R. W. "Digital Signal Processing", Printice Hall, 1975, and Kung S., "VLSI Processor Array", Prentice Hall 1987, which taught methods for the on-line processing of analog signal data, all of the methods would first require the traditional signal conversion from analog to digital domain, then store the entire command and data content at a local storage, and finally execute the commands when the user identifications are validated. These methods, though practical, require expensive high speed processing and memory circuits in order to reach the real time performance. Furthermore, these circuits must be constantly active in order to continuously monitor the signal channel for any incoming signal sequence. Finally, none of these methods have ever taught how to discriminate and eliminate the unauthorized or uninterested signals in the analog domain, namely prior to the analog to digital signal conversion, in order to avoid further storage and processing at the digital domain. It is conceived that these background arts will impose serious cost and power consumption disadvantage for their product implementation, and subsequently limit the market realization potential of these emerging technologies and applications.

In the relevant field of cryptography, similar situation remains. Although there are plenty of background arts which have taught how to apply highly sophisticated mathematical techniques and high speed scientific computer in order to generate the stored security key and to further encrypt the entire signal sequence. For example, Kahn B, Feiertag in "Private Communications in Mode Secure Systems" 1989, and Man Y. R. in "Cryptography and Secure Communications", McGraw Hill, 1994. However, it is extremely difficult to accomplish real time on-line decryption without depending on vector or parallel computing. The situation becomes worse, particularly when use of multiple analog waveform representation for encryption further demands multiple algorithms and computation.

In light of these storage and performance problems, prior to their conversion from analog to digital domain, some form of novel front-end-computation method for the online analog signals is necessary. It would be also necessary to make such method programmable, whereby a single device can be programed in order to adapt to the various application environments. Finally, it is further necessary to make such computation method simple yet effective so that the product realization can become economical and affordable at the marketplace. To date, no single device possesses the necessary computation and storage power, yet would only require nominal cost for its implementation, in order to process the incoming analog bitstream at the necessary real time performance.

SUMMARY OF THE INVENTION

It is therefore an object of the present invention to provide a system method for processing selective analog signals prior to their conversion from analog to digital domain, and more particularly a system method which employs sequential digital profiles to process incoming analog signals in order to detect signals (or fragments of signals) satisfying requirements represented by said sequential digital profiles.

It is still further an object of the present invention to apply said system method for the encryption and decryption of selective analog signals for privileged communications, wherein said decryption can be performed in real time prior to the signal conversion from analog to digital domain.

It is still further an object of the present invention to generalize said analog signals for including time-domain analog signals representing selective physical phenomena.

It is still further an object of the present invention to determine rules, conditions, and algorithms for the development of said sequential digital profiles.

It is still further an object of the present invention to perform on-line segmentation of said incoming analog signals according to selective properties of said sequential digital profiles.

It is still further an object of the present invention to represent results of said segmentation through on-line computation of a sequence of measurements in accordance with selective properties of said sequential digital profiles.

It is still further an object of the present invention to compare said results of segmentation with said sequential digital profiles in order to detect said incoming signals (or fragments of said incoming signals) satisfying requirements represented by said sequential digital profiles.

A preferred embodiment of the present invention is a system incorporating an input device, a memory device, a control unit, and a processing unit.

The input device acquires incoming analog signals. The memory device contains predefined sequential digital profiles. A single sequencial digital profile consists of the following components:

(i) a sequence of samples consisting of two values: a lower threshold value and a higher threshold value (the range of a sample);

(ii) a list of attributes divided into two subsets: in-segment attributes and off-segment attributes;

(iii) attribute values of said list of attributes for each sample of said sequence of samples.

The control unit supervises other components of the system according to a control algorithm, and interprets the results received from the processing unit. The general idea of the control algorithm performed by control unit is as follows:

(i) activate receiving an incoming analog signal by the input device;

(ii) activate a selected sequential digital profile;

(iii) send to the processing unit said list of attributes (both off-segment attributes and insegment attributes) of the active sequential digital profile;

(iv) select the first sample from said sequence of samples of the active sequential digital profile;

(v) send to the processing unit said range of the selected sample;

(vi) wait until attribute measurements are received from the processing unit;

(vii) if the received attribute measurements do not match said attribute values of the selected sample go to (iv);

(viii) if the selected sample is the last sample of said sequence of samples of the active sequential digital profile then either assume that the incoming analog signal satisfies requirements represented by the active sequential digital profile and quit the algorithm or assume that the current fragment of the incoming analog signal satisfies requirements of the active sequential digital profile and go to (ii);

(ix) select the next sample of said sequence of samples and go to (v).

The algorithm can be interrupted or suspended at any moment when no incoming analog signal is available from the input device.

The processing unit performs selective operations on said incoming analog signals. This includes on-line attribute measurements according to the list of attributes received from the control unit, and on-line segmentation according to the range thresholds received from the control unit. The general idea of the operations performed by the processing unit is as follows:

(i) perform on-line computation of attribute measurements for said of off-segment attributes received from the control unit, until the magnitude of the incoming signal is within said range received from the control unit (detecting the beginning of a segment);

(ii) perform on-line computation of attribute measurements for said in-segment attributes received from the control unit, until the magnitude of the incoming signal quits said range received from the control (detecting the end of a segment);

(iii) send the computed attribute measurements to the control unit and go to (i).

It is envisaged that in the practical applications of the invention selected steps of both above-mentioned algorithms can be performed parallelly and/or asynchronously in order to minimize delays and avoid discontinuities in processing the incoming analog signals.

BRIEF DESCRIPTION OF THE DRAWINGS

The present invention will become more fully understood from detailed description given herein below and the accompanying drawings which are given by way of illustration only, and thus are not limitative of the present invention and wherein.

DESCRIPTION OF THE PREFERRED EMBODIMENT

In the following description, particular reference is made to the implementation of the invention in the context of processing voltage signals. It is envisaged, however, that the practical applications of the invention can be extended to many other areas in which selective physical phenomena would be represented by the analog, time-domain signals.

Figure 1:
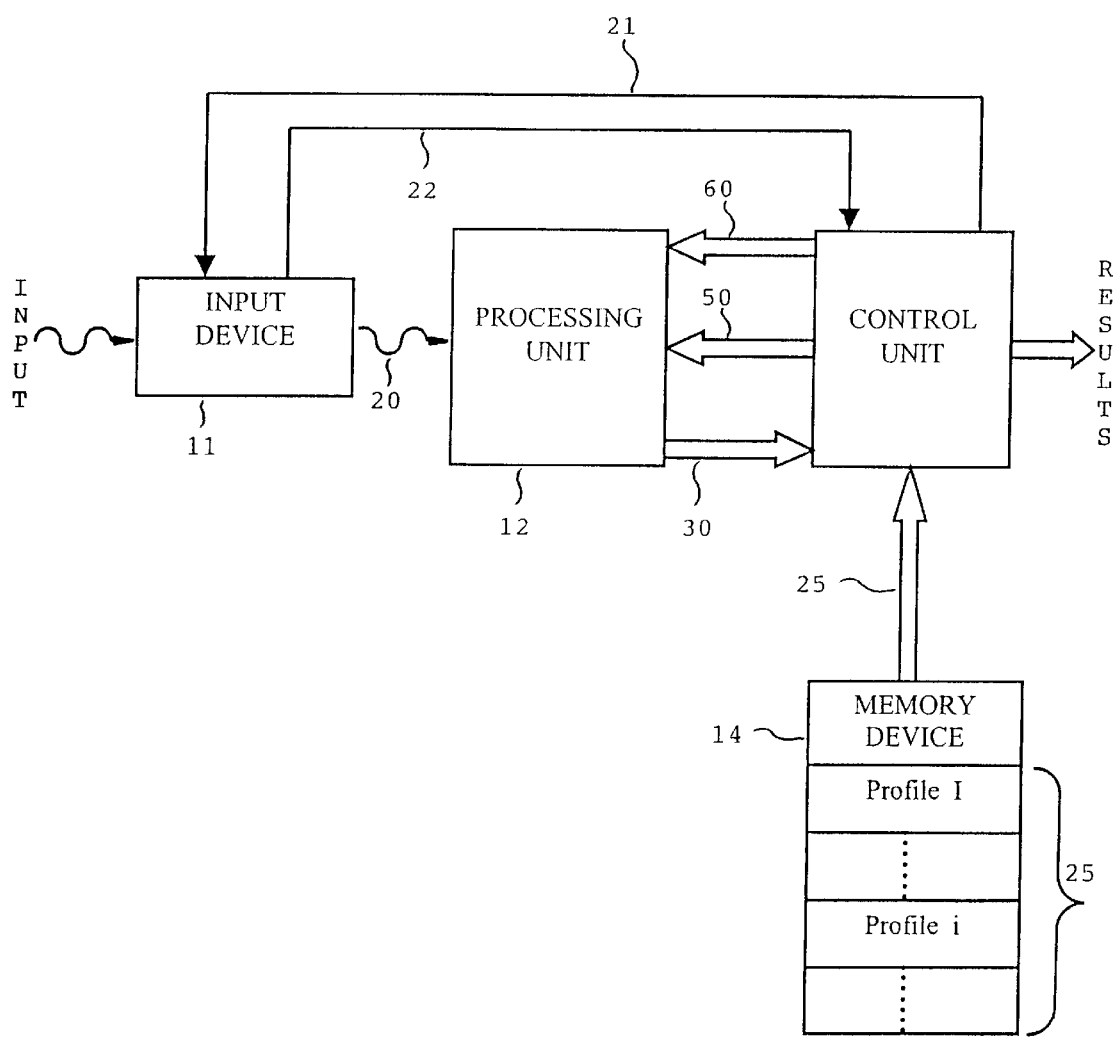
FIG. 1 is a general block diagram illustrating major components and data flow in a preferred embodiment of the present invention.

Referring to FIG. 1, the preferred system in which the present invention would be applied consists of the input device 11, the processing unit 12, the control unit 13. and the memory device 14

Incoming analog signals 20 are acquired from the input device 11, which is capable to capture continuously the magnitude of the signals. Acquisition of an incoming signal is activated by the signal 21 received from the control unit 13. The incoming signal 20 will be denotes as X(t). The signal 22 is to inform the control unit that no incoming signal is being received. Usually this should suspend or interrupt the control algorithm run by the control unit 13.

The incoming signal 20 is processed in the processing unit 12 according to the list of attributes 60, and the range 50 received from the control unit 13. This includes extraction of continuous segments of the incoming signal 20 being within the range 50, as well as computation of attribute measurements 30 according to the attributes 60. The processing unit 12 is equipped with the devices capable to perform the required computation on-line. The computed attribute measurements 30 are send to the control unit 13.

The control unit 13 runs a control algorithm, and interprets the attribute measurements 30 received from the processing unit 12. This includes activation of selected sequential digital profiles 25 from the profiles stored in the memory device 14. The active sequential digital profile 25 is retrieved from the memory device 14. The list of attributes 60 and the range 50 which are being send to processing 12 are extracted from the active sequential digital profile 25.

Figure 2:
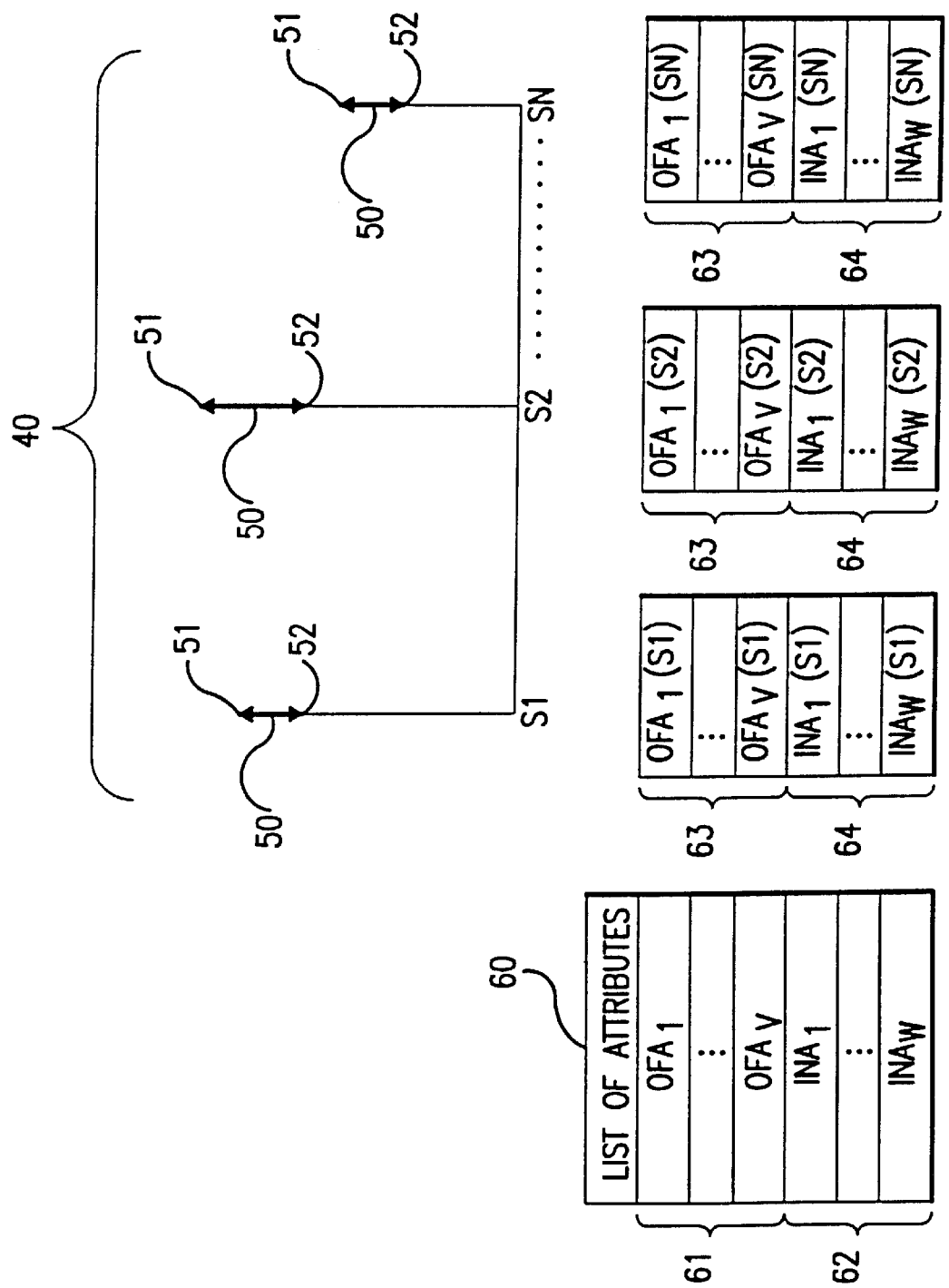
FIG. 2 shows a general structure of sequential digital profiles.

Referring to FIG. 2, sequential digital profiles 25 stored in the memory device 14 consist of the following components:

(i) the sequence of samples 40 {S1, S2, ..., Sn} wherein each sample Si (i=1, ... ,n) has its range 50 bounded by the higher threshold value HTi (51) and the lower threshold value LIi (52);

(ii) the list of attributes 60 consisting of off-segment attributes 61 {$OFA_1$, $OFA_2$, ..., $OFA_v$} and in-segment attributes 62 {$INA_1$, $INA_2$, ..., $INA_w$};

(iii) for each sample Si (i=1, ... ,n), the sequence of off-segment attribute values 63 {$OFA_1(Si)$, $OFA_2(Si)$, ..., $OFA_v(Si)$};

(iv) for each sample Si (i=1, ... ,n), the sequence of in-segment attribute values 64 {$INA_1(Si)$, $INA_2(Si)$, ..., $INA_w(Si)$}.

Figure 3:
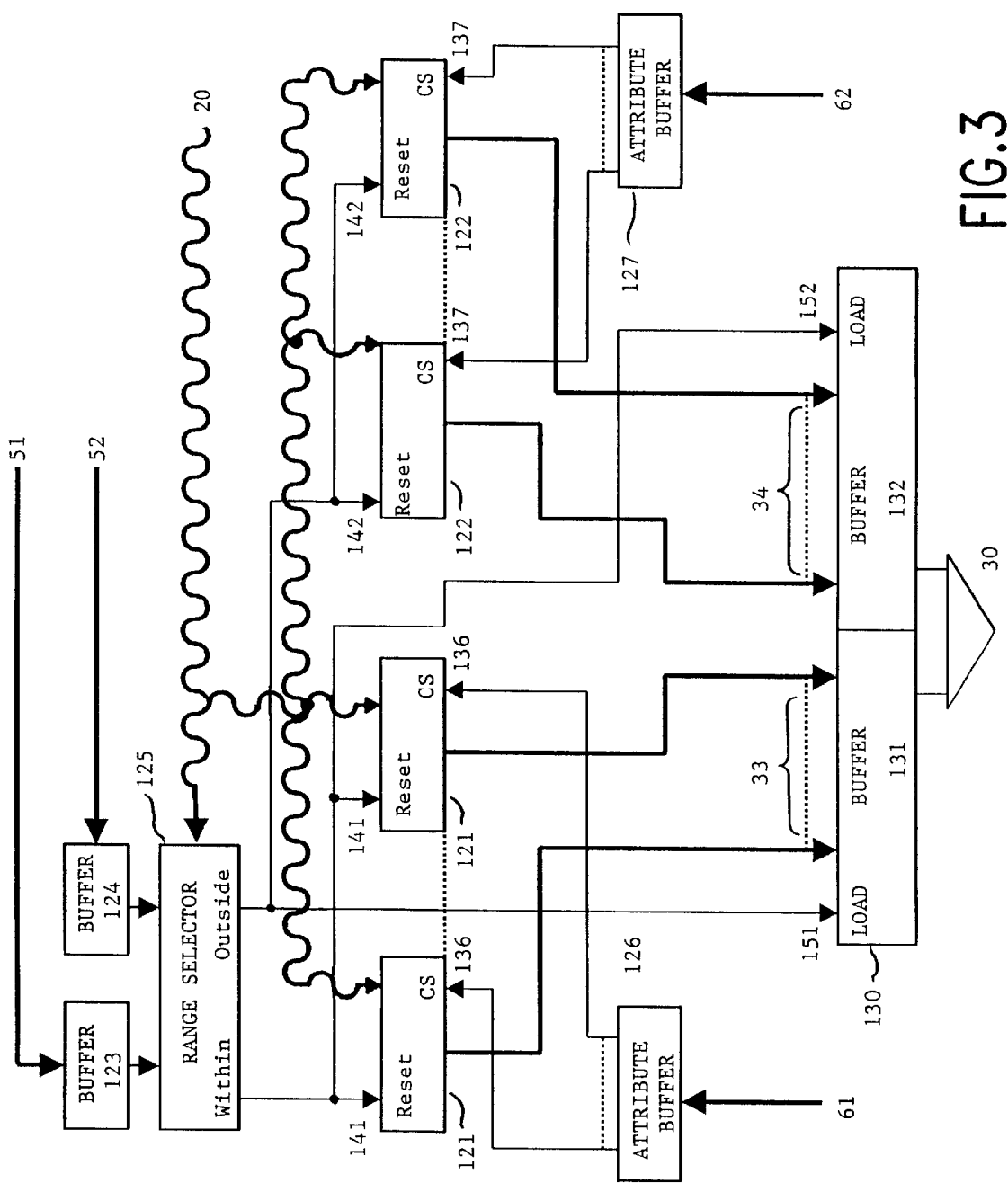
FIG. 3 shows a general structure of the processing unit.

Referring to FIG. 3, a general structure of the processing unit 12 comprises the following components:

the modules 121 performing on-line computation of off-segment attribute measurements 33 for all off-segment attributes which can appear in sequential digital profiles stored in the memory device 14;

the modules 122 performing on-line computation of in-segment attribute measurements 34 for all in-segment attributes which can appear in sequential digital profiles stored in the memory device 14;

the threshold buffers 123 and 124 containing the higher threshold value 51 and the lower threshold value 52 respectively;

the range selector 125 detecting whether the current magnitude of the incoming signal 20 is within the range defined by the thresholds 51 and 52 received from the buffers 123 and 124 respectively;

the attribute buffer 126 activating (using CS signals 136) selected said modules 121 according to the list of off-segment attributes 61;

the attribute buffer 127 activating (using CS signals 137) selected said modules 122 according to the list of in-segment attributes 62;

the measurement memory 130 (consisting of the off-segment buffer 131 and the in-segment buffer 132) memorizing the attribute measurements 30 comprising the off-segment attribute measurements 33 and the in-segment attribute measurements 34, wherein the off-segment attribute measurements 33 are received from the modules 121 and memorized in the buffer 131, while the in-segment attribute measurements 34 are received from the modules 122 and memorized in the buffer 132.

The reset signals 141 and the load signal 151 are arranged so that the off-segment attribute measurements 33 are computed when the incoming signal 20 is outside the range defined by the thresholds 51 and 52, and said measurements are memorized in the buffer 131 when the incoming signal 20 enters said range.

The reset signals 142 and the load signal 152 are arranged so that the in-segment attribute measurements 34 are computed when the incoming signal 20 is within the range defined by the thresholds 51 and 52, and said measurements are memorized in the buffer 132 when the incoming signal 20 quits said range.

Figure 4:
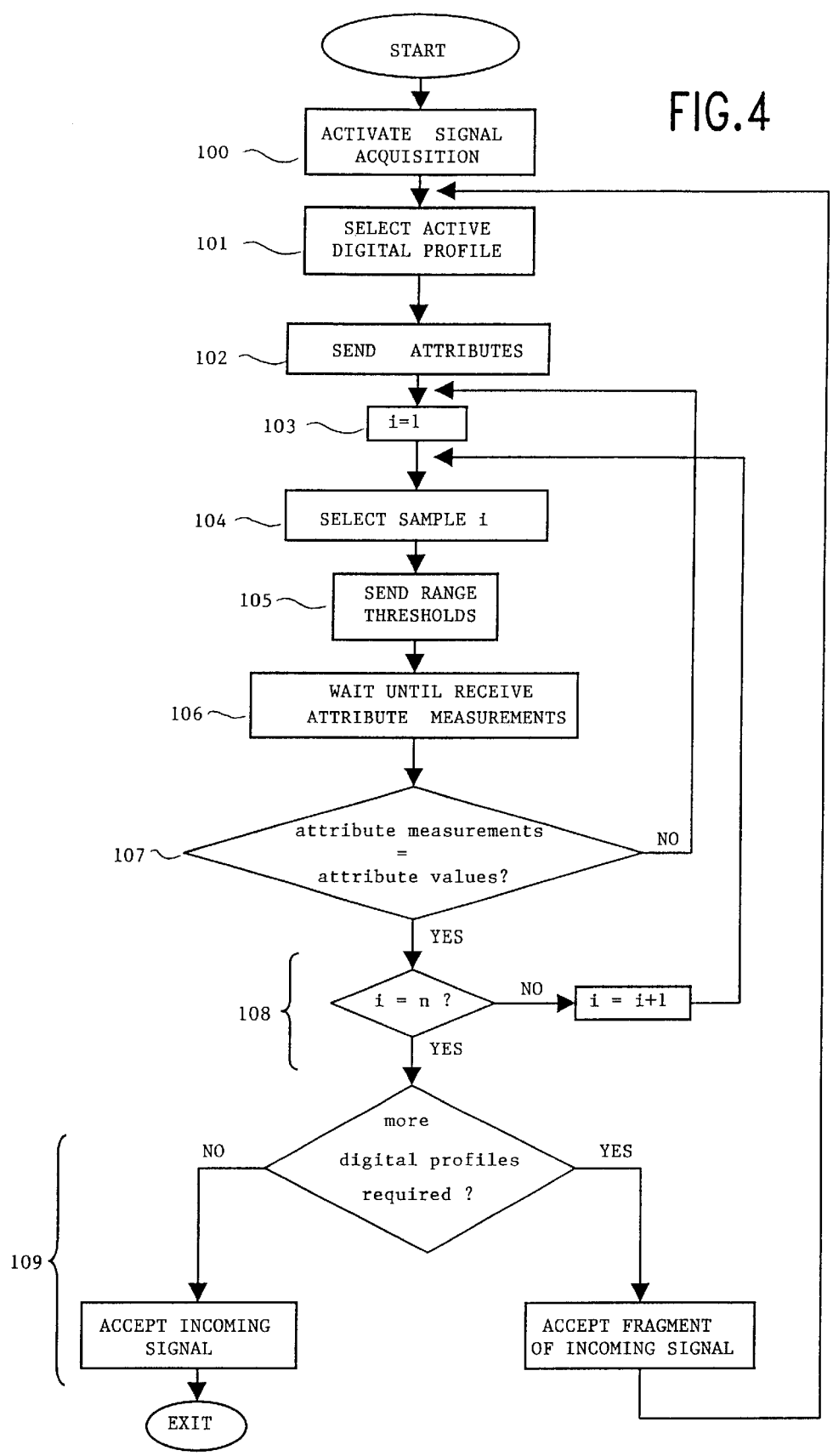
FIG. 4 is a flowchart illustrating in a broad sense the steps of the algorithm performed in the control unit of the preferred embodiment of the present invention.

Referring to FIG. 4, the algorithm performed in the control unit 13 comprises the following steps:

Step 100 Send the signal 21 to initialize acquisition of an incoming analog signal 20 X(t) from the input device 11.

Step 101 Select an active sequential digital profile 25, and retrieve it from the memory device 14.

Step 102 Send the list of attributes 60 of the active sequential digital profile 25 to the buffers 126 and 127 of the processing unit 12.

Step 103 Set i=1.

Step 104 Select the sample Si from the sequence of samples 40 of the active sequential digital profile 25.

Step 105 For the selected sample Si, send the higher threshold value HTi (51) and the lower threshold value LTi (52) to the buffers 123 and 124 of the processing unit 12.

Step 106 Wait until the attribute measurements 33 {$MeOFA_1$, $MeOFA_2$, ..., $MeOFA_v$} (corresponding to the off-segment attributes 61 {$OFA_1$, $OFA_2$, ..., $OFA_c$}) and the attribute measurements 34 {$MeINA_1$, $MeINA_2$, ..., $MeINA_w$} (corresponding to the in-segment attributes 62 {$INA_1$, $INA_2$, ..., $INA_w$}) are received from the buffers 131 and 132 of the processing unit 12.

Step 107 If
{$MeOFA_1$, $MeOFA_2$, ..., $MeOFA_v$}≠{$OFA_1(Si)$, $OFA_2(Si)$, ..., $OFAv(Si)$}
or
{$MeINA_1$, $MeINA_2$, ..., $MeINA_w$}≠{$INA_1(Si)$, $INA_2(Si)$, ..., $INA_w(Si)$}
goto Step 103.

Step 108 If (i<n) then
i=i+1; goto Step 104

Step 109 If more sequential digital profiles required then accept the received fragment of the signal X(t); goto Step 101 else
accept the received signal X(t); exit.

The algorithm can be suspended or terminated at any moment when the signal 22 is received from the processing unit 12, i.e. when no incoming signal 20 is available.

The abovementioned algorithm is given by way of illustration and example only and is not to be taken by way of limitation, so that in the future embodiments other algorithms based on the same principles could be applied. In particular, selected steps of the algorithm can be performed parallelly, asynchronously or can be pipelined in order to minimize delays and avoid discontinuities in processing the incoming analog signal 20.

Figure 5:
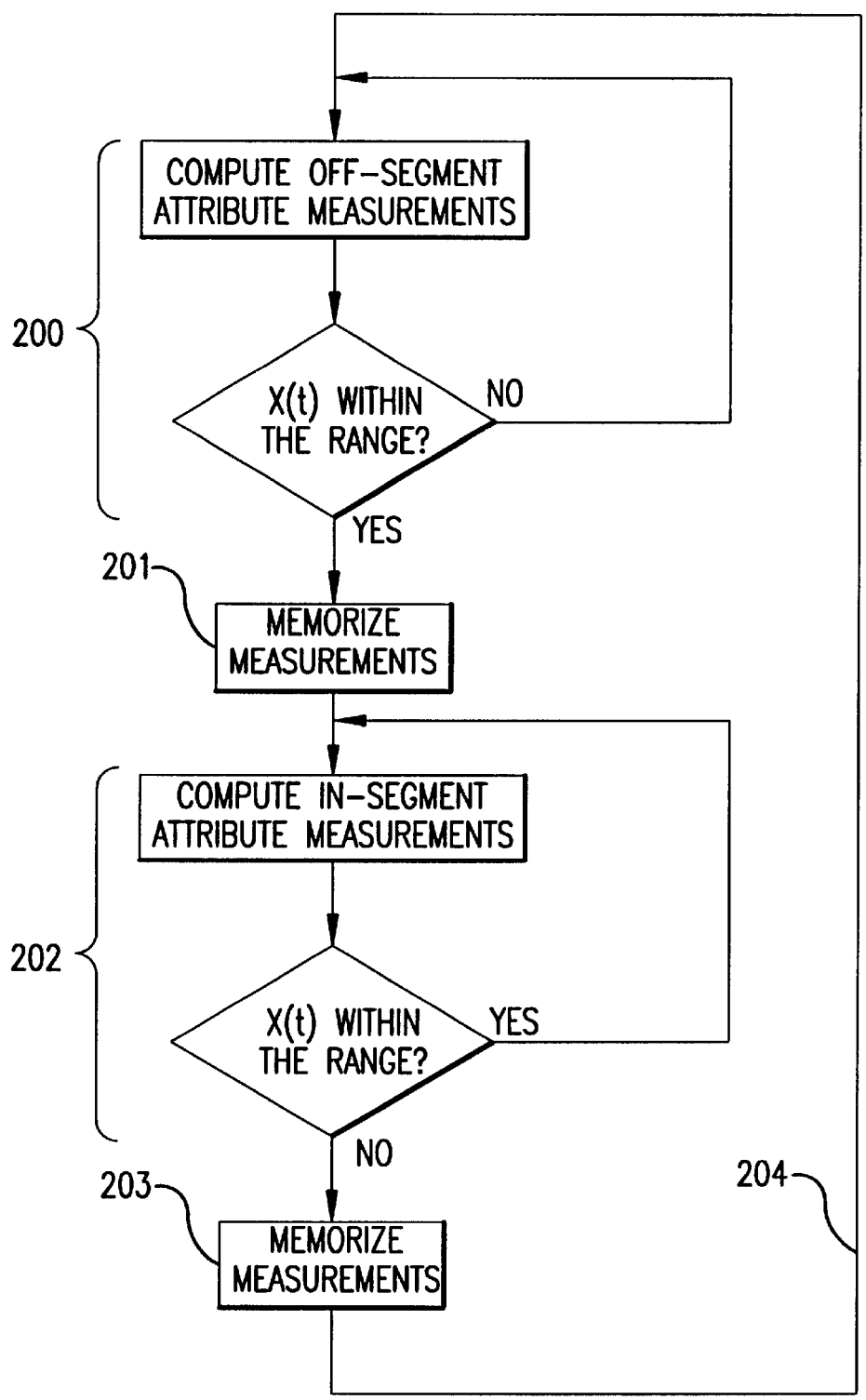
FIG. 5 is a flowchart illustrating in a broad sense the steps of the algorithm performed in the processing unit of the preferred embodiment of the present invention.

Referring to FIG. 5, the algorithm performed in the processing unit 12 has the following structure:

Step 200 Perform on-line computation of off-segment attribute measurements 33 using modules 121 selected according to the content of the buffer 126 until the magnitude of X(t) is inside the range defined by the content of the threshold buffers 123 and 124.

Step 201 Memorize said measurements 33 of Step 200 in the measurement buffer 131, and reset the modules 122 selected according to the content of the buffer 127.

Step 202 Perform on-line computation of in-segment attribute measurements 34 using modules 122 selected according to the content of the buffer 127 until the magnitude of X(t) is outside the range defined by the content of the threshold buffers 123 and 124.

Step 203 Memorize said measurements 34 of Step 202 in the measurement buffer 132, and reset the modules 121 selected according to the content of the buffer 126.

Step 204 Goto Step 200.

Figure 6:
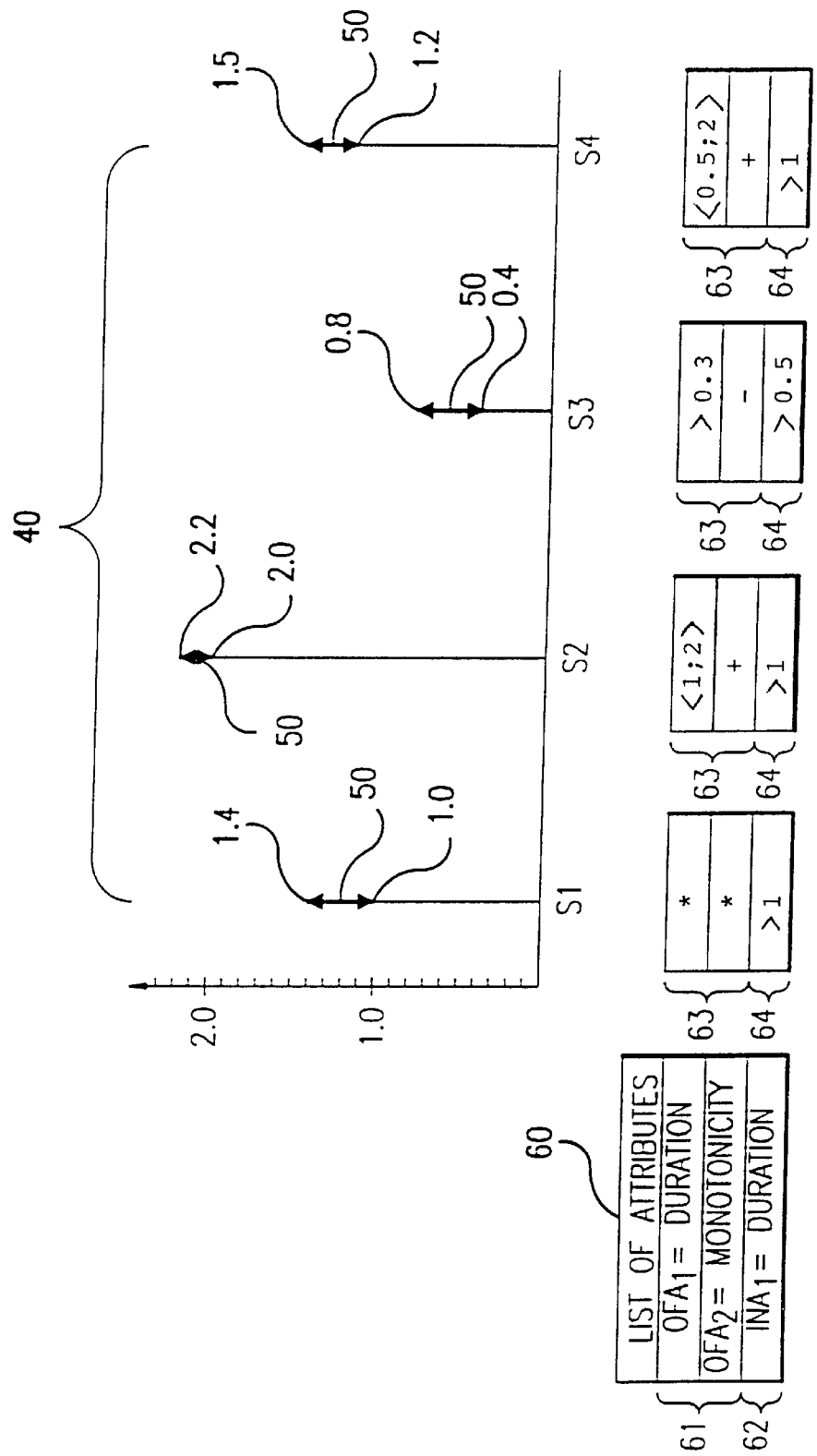
FIG. 6 shows an example of a sequential digital profile according to the general structure of FIG. 2.

FIG. 6 shows an example of a sequential digital profile 25 according to FIG. 2 wherein:

(i) the sequence of samples 40 contains four samples: S1, S2, S3, S4;

(ii) the list of attributes 60 consists of the following off-segment attributes 61 {$OFA_1$=Period_of_duration, $OFA_2$=Type_of_monotonicity}, and the following in-segment attributes 62 {$INA_1$=Period_of_duration};

(iii) the sequences of off-segment attribute values 63 are {$OFA_1(SI)$="don't care", $OFA_2(S1)$="don't care"}, {OFA₁ (S2)="1.0 sec÷2.0 sec", OFA₂(S2)= "increasing"}
{OFA₁(S3)=">0.3 sec", OFA₂(S3)="decreasing"},
{OFA₁(S4)="0.5÷2.0 sec", OFA₂(S4)="increasing"};
(iv) the sequences of in-segment attribute values 64 are:
{INA₁(S1)=">1.0 sec"},
{INA₁(S2)=">1.0 sec"},
{INA₁(S3)=">0.5 sec"},
{INA₁(S4)=">1.0 sec"}.

Figure 7:
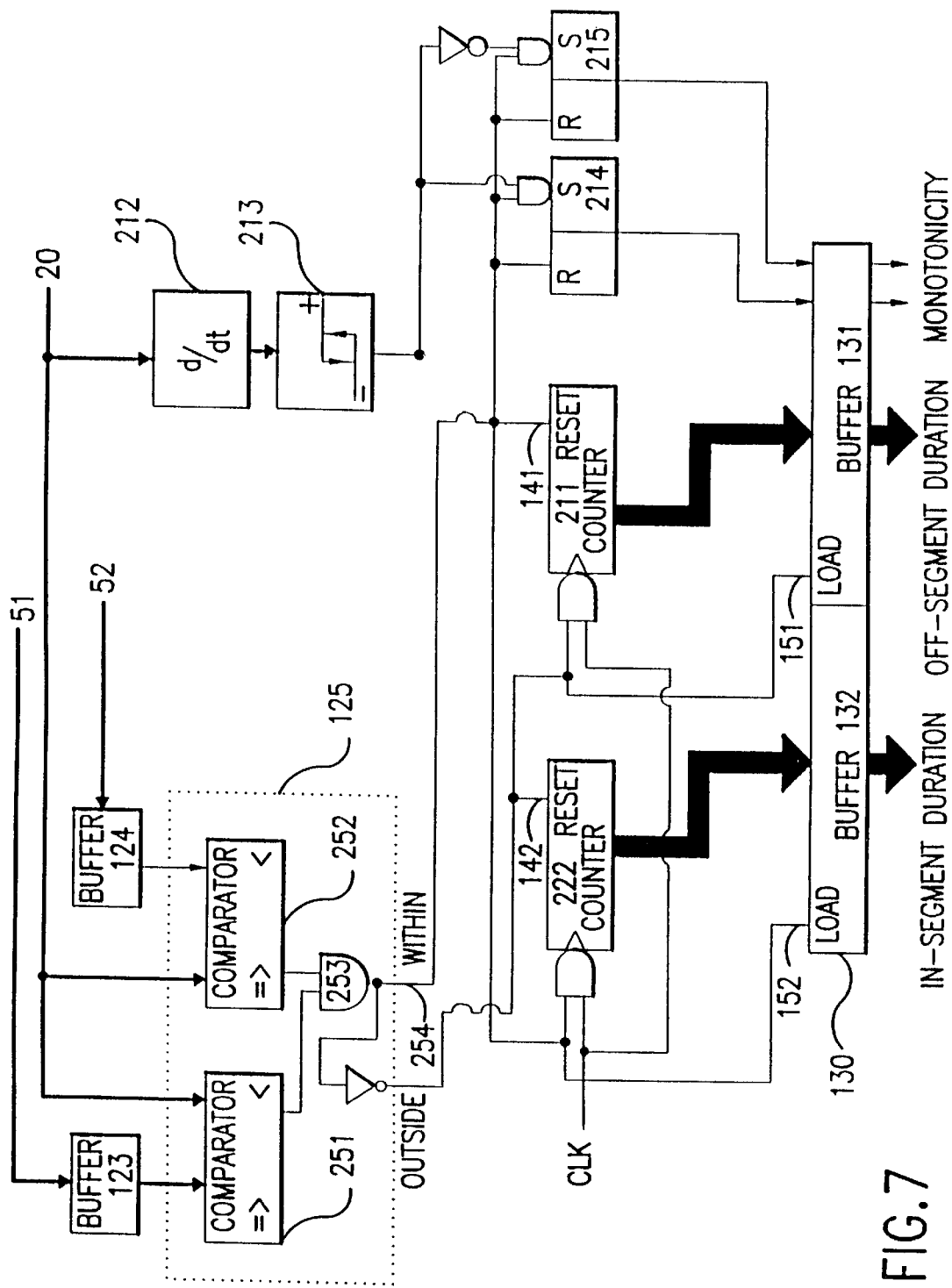
FIG. 7 shows an example of the processing unit which can perform computation of attribute measurements required for the sequential digital profile of FIG. 6.

FIG. 7 shows a design of a processing unit 12 which can perfom attribute measurements required for the sequential digital profile of FIG. 6. The structure of the unit corresponds to the general structure of FIG. 3.

The range selector 125 consists of two analog comparators 251 and 252 comparing the incoming signal 20 to the content of the range buffers 123 and 124 respectively. The AND-gate 253 provides that the binary output 254 of the range selector 125 is set ONE when the incoming signal 20 is within said range, and ZERO otherwise.

There are two modules 121, i.e. the module to perform Period_of_duration measurements, and the module to perform Type_of_monotonicity measurements. The module performing Period of duration measurements consists of the digital counter 211 with the reset signal 141 connected to the ouput 254. The clock input of the counter 211 is connected to the external signal generator. The module performing Type_of_monotonicity measurements consists of the differentiating element 212, the sign detector 213, and two flip-flops 214 and 215. The small histeresis loop has been added in the sign detector 213 in order to compensate minor variations of the incoming signal 20. The flip-flop 214 is set whenever the derivative of the incoming signal 20 is positive, and the flip-flop 215 is set whenever the derivative of the incoming signal 20 is negative. The reset signal 141 resets the flip-flops 214 and 215 and closes their Set input AND-gates.

There is only one module 122 to perform Period_of_duration measurements. It consists of the digital counter 222 with the reset signal 142 connected to the inverted output 254. The clock input of the counter 222 is connected to the external signal generator.

The measurement buffer 131 is a latch register with two inputs connected to flip-flops 214 and 215, and the rest of inputs connected to the counter 211. The load signal 151 is connected to the inverted output 254.

The measurement buffer 132 is a latch register with the inputs connected to the counter 222. The load signal 152 is connected to the output 254.

The attribute buffers 126 and 127 are not incorporated since there is only one sequential digital profile requiring measurements performed by all available modules 121 and modules 122.

Therefore, the attribute measurements 30 (comprising off-segment attribute measurements 33 and in-segment attribute measurements 34) are represented as follows:
Off-segment Period_of_duration—the corresponding output bits of the buffer 131;
Off-segment Type_of_monotonicity—two output bits of the buffer 131, wherein
01 represents "decreasing";
10 represents "increasing";
11 represents "no_monolonicity";
In-segment Period_of_duration—the output bits of the buffer 132.

FIGS. 8 to 11 show examples of incoming analog signals 20 being processed by the algorithm of FIG. 4 using processing unit of FIG. 7 and the sequential digital profile 25 of FIG. 6. The extracted segments 81, 82, 83 and 84 correspond respectively to the samples S1, S2, S3 and S4 from the sequence of samples 40. Some of the above mentioned segments may repeat within incoming signals 20 because of Step 107 of said algorithm which restarts analysis from the first sample S1 after unsuccessful attempt to extract segments corresponding to all samples of the sequence of samples 40. The lists 91, 92, 93 and 94 contain the corresponding attribute measurements 33 and 34 (the measurements which do not match the corresponding attribute values from the sequences 63 and 64 are crossed).

Figure 8:
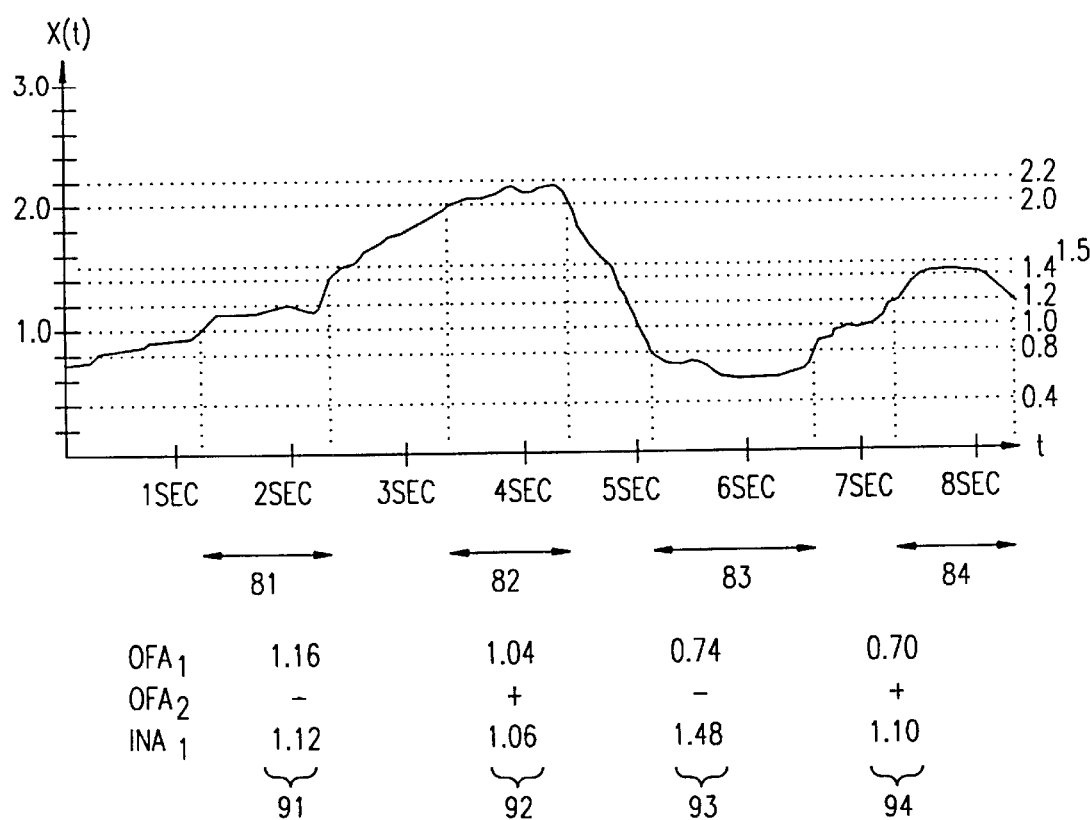
FIGS. 8 to 11 show examples of incoming analog signals and results of the processing performed by the algorithm of FIG. 4 using processing unit of FIG. 7 and the sequential digital profile of FIG. 6.
Figure 9:
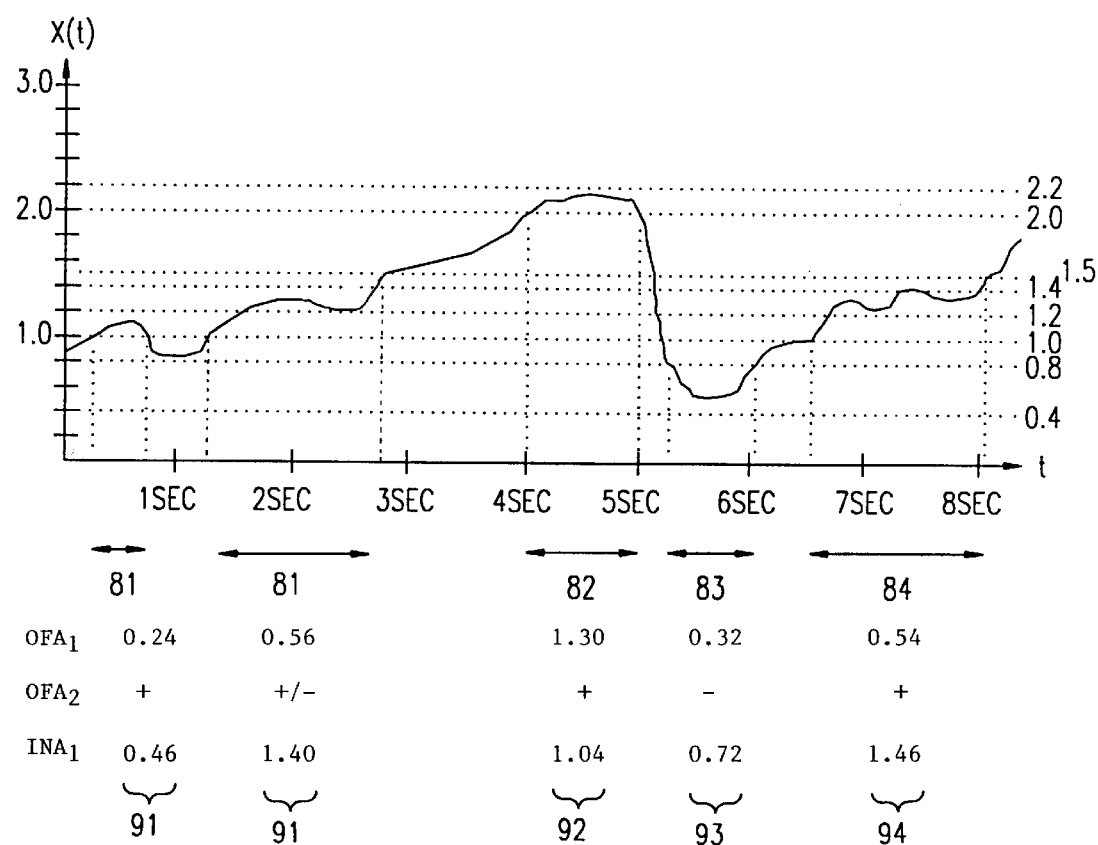
Figure 10:
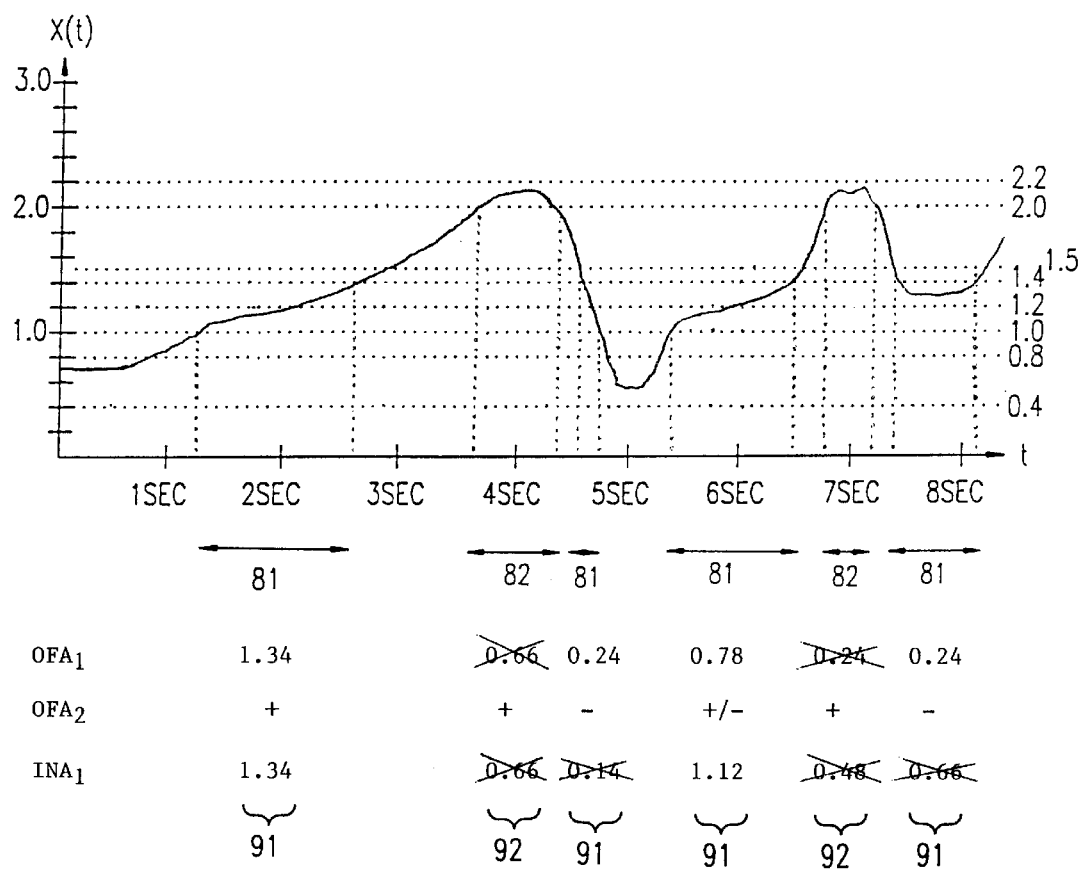
Figure 11:
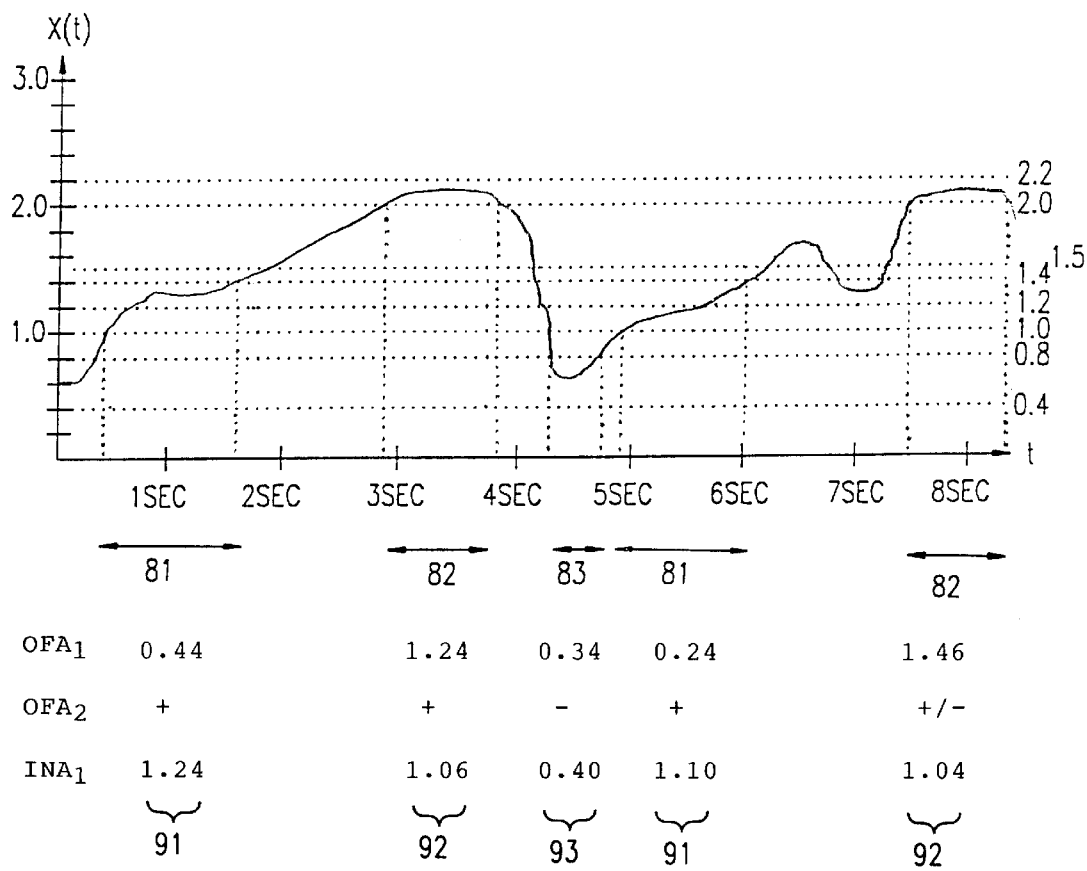

Therefore, the signals of FIG. 8 and FIG. 9 satisfy the requirements of the sequential digital profile 25 of FIG. 6, while the signals of FIG. 10 and FIG. 11 do not.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for the decryption of an incoming encrypted signal sequence, wherein encryption can be performed through inserting analog identification signals prior to, in between, and/or after a partitioned analog signal segments, said method preclude encryption by rearrangement of sequential order, said method directing incoming encrypted signal sequence for decryption through deletion of all identification signals and determining and locating the identification signals within said incoming encrypted signal sequence through recognizing those signal segments which can conform with or satisfy digital representation requirement, comprising the following steps:
(i) storing or receiving digital representation requirement;
(ii) receiving an incoming encrypted signal sequence;
(iii) determining and locating single or plurality of identification signals within said incoming encrypted signal sequence through recognizing those signal segments which can conform with or satisfy said digital representation requirement;
and
(iv) directing said incoming encrypted signal sequence for decryption through deletion of all identification signals without rearrangement of sequential order, and reconstruction of said incoming signal sequence to its original form.

2. A system for the decryption of an incoming encrypted signal sequence, wherein encryption can be performed through inserting analog identification signals prior to, in between, and/or after a partitioned analog signal segments, said system preclude encryption strictly by rearrangement of sequential order, said method directing incoming encrypted signal sequence for decryption through deletion of all identification signals and determining and locating the identification signals within said incoming encrypted signal sequence through recognizing those signal segments which can conform with or satisfy digital representation requirement, comprising:
means for storing or receiving digital representation requirement;
means for receiving an incoming encrypted signal sequence;
means for determining and locating single or plurality of identification signals within said incoming encrypted signal sequence through recognizing those signal segments which can conform with or satisfy said digital representation requirement;

and means for directing said incoming encrypted signal sequence for decryption through deletion of all identification signals without strictly rearrangement of sequential order, and reconstruction of said incoming signal sequence to its original form.

3. A signal security method for the encryption and decryption of an analog signal sequence for privileged communication, wherein said decryption can be performed in real time prior to signal conversion from analog to digital domain, comprising the following steps:

(i) creating digital representations each with unique behavior, step (i) further comprising a library, which stores all said digital representations;

(ii) selecting an unique combination of said digital representation in preparation for a privileged communication, step (ii) further randomly generating a set of analog identification signals with random waveform appearance and yet preserving common behavior as described in said digital representation, step (ii) further communicating said digital representation to a designated privileged user;

(iii) encrypting the entire or partial content of the privileged analog signal sequence wherein said encryption can be performed according to the partition of said privileged analog signal sequence and the insertion of said analog identification signals prior to, in between, and/or after said partitioned analog signal sequence, the resultant encrypted analog signal sequence becomes totally destructed to unauthorized users, step (iii) further delivering said encrypted analog signal sequence to said designated privileged user;

(iv) producing a sequence of computation instructions for each of said selected digital representation;

(v) for said privileged user, interfacing with selective single or plurality of input devices for receiving randomly arrived incoming encrypted analog signal sequence;

(vi) measuring said incoming encrypted analog signal sequence prior to its conversion from analog to digital domain, according to said computation instruction directed from step (iv);

(vii) determining and locating said analog identification signals within said incoming encrypted analog signal sequence through recognizing those signal segments which can conform with said digital representation requirement;

(viii) directing said incoming encrypted analog signal sequence for decryption through deletion of all said identification signals and reconstruction of said incoming analog signal sequence to its original form, step (viii) further provides signal conversion from analog to digital domain for further processing of said fully reconstructed analog signal sequence; and (ix) directing overall system control and management, which includes activation and deactivation of said input devices.

4. A signal security system for encryption and decryption of a privileged analog signal sequence, wherein decryption can be performed, comprising:

a privileged analog signal sequence;

means for creating a single or plurality of digital representation each equip with unique behavior;

means for selecting an unique combination of said digital representation;

means for randomly generating a set of analog identification signals with random waveform appearance and yet preserving common behavior as described in said digital representation;

directing entire or partial content of said privileged analog signal sequence for encryption, wherein said encryption can be performed according to partition of said privileged analog signal sequence and the insertion of said analog identification signals prior to, in between, and/or after said partitioned analog signal sequence;

means for receiving incoming encrypted analog signals; means for measuring said incoming analog signal; means for determining and locating identification signals within said incoming encrypted analog signal sequence through recognizing those signal segments which can conform with said digital representation requirement;

decryption means for directing said incoming analog signal for decryption through deletion of all said identification signals.

5. A signal security system for the encryption and decryption of an analog signal sequence, comprising:

an analog signal sequence;

means for creating a single or plurality of digital representation, wherein each equip with an unique behavior;

means for randomly generating a set of analog identification signals with random waveform appearance and yet preserving common behavior as described in said digital representation; and encrypting means for directing the entire or partial content of said analog signal sequence for encryption, wherein said encryption can be performed according to the partition of said analog signal sequence and the insertion of said analog identification signals prior to, in between, and/or after said partitioned analog signal sequence.

6. A signal security system in accordance with claim 5, said system further comprising a decryption means wherein decryption can be performed, said decryption means comprising:

means for privileged users for receiving incoming encrypted analog signal sequence;

means for measuring said incoming encrypted analog signal sequence;

means for determining and locating identification signals within said incoming encrypted analog signal sequence through recognizing those signal segments which can conform with or satisfy said digital representation; and decryption means for deletion of all said identification signals.

7. A signal security system in accordance with claim 6, wherein said decryption means further provides signal conversion from analog to digital domain for further processing of said signal sequence.

8. A signal security system in accordance with claim 5, further comprising means for overall system control and management.

9. A signal security system in accordance with claim 8, said means for overall system control and management further comprising means for activation and deactivation of said input devices for receiving an incoming encrypted analog signal sequence.

10. A signal security system in accordance with claim 5, wherein said digital representation means further comprises a library or storage, which stores all of said digital representations.

11. A signal security system in accordance with claim 5, further comprising means for updating and/or selecting said unique combination of single or plurality of said digital representation.

12. A method for encryption and decryption of an analog signal, wherein encryption and decryption are performed in analog domain, comprising the following steps:
   (i) a transmitter creating digital representations;
   (ii) randomly generating analog identification signals with random waveform appearance and yet preserving common behavior as in said digital representation;
   (iii) encryption through partitioning said analog signal and inserting said analog identification signals prior to, in between, and/or after said partitioned analog signal segments, as a result, encrypted analog signal sequence becomes totally destructed to unauthorized receivers;
   (iv) for authorized receivers, monitoring and/or measuring incoming analog signal;
   (v) locating identification signals within said incoming signal sequence through satisfying said digital representation; and
   (vi) decryption through deleting all said identification signals and reconstructing said incoming analog signal to its original form.

13. A system for encryption and decryption of an analog signal, wherein encryption and decryption are performed in analog domain, comprising:
   digital representation;
   computation instructions for each digital representation;
   analog identification signals with random waveform appearance and yet preserving common behavior as in said digital representation;
   encryption means for partitioning said analog signal and inserting said analog identification signals prior to, in between, and/or after said partitioned analog signal segments, as a result, an encrypted analog signal sequence becomes totally destructed to unauthorized receivers;
   for authorized receivers:
   means for monitoring and/or measuring incoming analog signal according to said computation instruction;
   means for locating identification signals within said incoming signal sequence through satisfying said digital representation; and
   decryption means for deleting all said identification signals and reconstructing said incoming analog signal to its original form.

14. A analog signal processing system, wherein analog identification signals can be produced with random waveform appearance and yet preserving common behavior as described in corresponding digital representation, comprising:
   digital representation means; and
   means for generating analog identification signals with random waveform appearance and yet preserving common behavior as described in said digital representation.

15. A signal processing system wherein analog enclosure signals can be inserted, comprising:
   means for partitioning analog signal into a plurality of segments;
   digital representation means;
   means for generating analog enclosure signals with random waveform appearance and yet preserving common behavior as described in said digital representation;
   means for inserting said analog enclosure signals prior to, in between, and/or after said partitioned analog signal segments.

16. A signal processing system in accordance with claim 15, wherein said digital representation further comprising computation instructions in correspondence with said digital representation.

* * * * *